US006292197B1

(12) United States Patent
Langelaan

(10) Patent No.: US 6,292,197 B1
(45) Date of Patent: *Sep. 18, 2001

(54) COMPUTER GRAPHICS SYSTEM FOR MODELING OBJECTS THAT INCLUDE SEGMENTS OF AN INTERSECTION OF A MODULAR MATRIX OF RECTANGLES AND AN ELLIPTIC, A LENTICULAR OR A RHOMBIC SEGMENT

(76) Inventor: J. Willem R. Langelaan, 901 Parkland Avenue, Mississauga, Ontario (CA), L5H 3G9

( * ) Notice: Subject to any disclaimer, the term of this patent is extended or adjusted under 35 U.S.C. 154(b) by 0 days.

This patent is subject to a terminal disclaimer.

(21) Appl. No.: 09/034,568

(22) Filed: Mar. 4, 1998

(51) Int. Cl.[7] .................................................. G06T 15/30
(52) U.S. Cl. .......................... 345/434; 345/421; 345/423; 345/441
(58) Field of Search .................................... 345/434, 433, 345/441, 420, 421, 423

(56) References Cited

U.S. PATENT DOCUMENTS 5,870,106 * 2/1999 Langelaan ............................ 345/441

* cited by examiner

Primary Examiner—Almis R. Jankus
Assistant Examiner—Kimbinh T. Nguyen
(74) Attorney, Agent, or Firm—Gowling Lafleur Henderson LLP

(57) ABSTRACT

A computer graphics system is disclosed. The system is for modeling parametric objects having segments of an intersection of a modular matrix of rectangles and an elliptic, lenticular or rhombic segment. The system includes a retrieval and display function for an object which include segments of an intersection of a modular matrix of rectangles and an elliptic, lenticular or rhombic segment. The resulting intersection segments have boundary surfaces that intersect at vertices and which have a common origin. The system includes a calculation of the location of the vertices relative to the common origin and evaluates and discards invalid vertices. The system also calculates the boundary surfaces of intersection segments, defined by valid vertices. Output is provided in the form of geometrically accurate and undistorted digital models. In one embodiment the system is useful in designing doors, windows and the like which have segments of an intersection of a modular matrix of rectangles and an elliptic, lenticular or rhombic segment in an architectural CAD program.

18 Claims, 15 Drawing Sheets

| Type n° | Plane ab | Plane bc | Plane ad | Plane dc | Ellipse & Lentis | Rhombus |
|---|---|---|---|---|---|---|
| S1 | e |  | f |  |  |  |
| S2 | e |  |  | f' |  |  |
| S3 |  | e' | f |  |  |  |
| S4 |  | e' |  | f' |  |  |
| S5 |  |  |  |  |  |  |

COMPUTER GRAPHICS SYSTEM FOR MODELING OBJECTS THAT INCLUDE SEGMENTS OF AN INTERSECTION OF A MODULAR MATRIX OF RECTANGLES AND AN ELLIPTIC, A LENTICULAR OR A RHOMBIC SEGMENT

FIELD OF THE INVENTION

The present invention relates generally to computer aided graphics system, such as a computer aided design (CAD) or computer aided manufacturing (CAM) system. More specifically the invention relates to computer graphic systems capable of modeling parametric objects.

BACKGROUND OF THE INVENTION

It is a time consuming process to construct in 2D or in 3D space a graphical representation of an object which includes segments of an intersection of a modular matrix of rectangles and an elliptic, lenticular or rhombic segment. A modular matrix of rectangles consists of rows and columns of modular spaced equal rectangles. The spacing module of the rows is independent of the spacing module of the columns. Objects which include segments of an intersection of a modular matrix of rectangles and an elliptic, lenticular or rhombic segment may be part of complex geometric designs for example used in architecture for doors, windows or other applications.

At present, to generate an image incorporating segments of an intersection of a modular matrix of rectangles and an elliptic, lenticular or rhombic segment requires that the location of the vertices of the resulting segments is solved before the representation is drawn either on paper or on a computer. However, the image so created is specific to the attributes which are given (length, width, number of columns and rows of rectangles and the like), and cannot be used except with those attributes. Changing any value of the attributes of the modular matrix of rectangles or of the elliptic, lenticular or rhombic segment such as the spacing and/or widths of the rectangles or the aspect ratio of the elliptic, lenticular or rhombic segment, usually requires redrawing the entire image of the intersection of a modular matrix of rectangles and an elliptic, lenticular or rhombic segment.

To alleviate this problem computer graphics systems sometimes include a database with geometric data for a finite number of pre-constructed instances of objects with an intersection of a modular matrix of rectangles and an elliptic, lenticular or rhombic segment. The usability of such graphic system remains limited to the selection of those instances which are stored in the database. Changing the total width or length of such pre-constructed object may result in a degeneration of the selected geometry which the user cannot correct. Such degeneration, in the context of a computer graphics system for design, such as an architectural modeling program, is clearly unacceptable, because of the loss of dimensional accuracy and the geometrical distortion which results.

SUMMARY OF THE INVENTION

What is required, is to provide a generalized, parametric object whose geometric attributes have values that are implemented in the output. Most preferably, the user should be able to specify and set attribute values so the user can efficiently design and re-design a nearly unlimited variety of geometrically specific solutions.

This invention relates to a method for generating representations of objects which include segments of an intersection of a modular matrix of rectangles and an elliptic, lenticular or rhombic segment. The segments may be grouped together to form a segmented section. To be parametric and devoid of anamorphism, the geometry must retain its encapsulated and/or user specified attribute values after an orthogonal transformation. For example the width of elliptic elements and the width of linear elements must remain constant and in conformity with their attribute values for any variations of the elliptic, lenticular or rhombic segment's width to length aspect ratios that result from the design process.

It is an object of the present invention to provide a computer graphics system that can solve the drawbacks of known prior systems and can provide improved modeling for designing and prototyping efficiencies.

Another and more specific object of the present invention is to provide a computer graphics system that provides the user with a generalization of the geometry of an intersection of a modular matrix of rectangles and an elliptic, lenticular or rhombic segment, which the user can transform into a nearly unlimited number of geometrically specific solutions.

A further object of the invention is to provide a computer graphics technology that supports the efficient design of objects which include segments of an intersection of a modular matrix of rectangles and an elliptic, lenticular or rhombic segment. For example, it is an object of the system to enable an interactive cyclical design process of:

inputting the segment's attribute values;

receiving 2D or 3D visual feedback;

evaluation of the representation presented; and editing the attribute values of the segment to produce a further more desirable representation.

In order to accomplish the afore-mentioned and other objects, a system for generating 2D or 3D representations of objects which include segments of an intersection of a modular matrix of rectangles and an elliptic, lenticular or rhombic segment according to the present invention, includes an input means for entering the position, orientation and attribute values of the object. The system may also include geometrical evaluation and simplification methods based on shape grammars. Shape grammars are a set of rules to evaluate and specify geometrical attributes and relationships. For example the preferred invention checks that no invalid and no undesirable geometries occur.

Therefore, according to the present invention, there is provided a computer graphics system for parametric modeling of segmented objects, said system comprising:

a means to define a modular matrix having rectangles which include boundary surfaces, said boundary surfaces intersecting at vertices;

a means to define an elliptic, lenticular or rhombic segment;

a means to define a common origin for said matrix and said elliptic, lenticular or rhombic segment; and a means to intersect said matrix and said elliptical, lenticular or rhombic segment, said intersecting means comprising:

a means to relate said vertices to said common origin to define a location of each of said vertices relative to said elliptic, lenticular or rhombic segment;

a means to evaluate said defined locations of said vertices to discard invalid vertices and define valid vertices; and means to determine the boundary surfaces of individual segments defined by said valid vertices;

wherein a geometrically accurate and undistorted model of said segmented object is provided as output.

The intersection of a modular matrix of rectangles and an elliptic, lenticular or rhombic segment may receive attribute values from constituent components of the object.

The field of application for this method includes but is not limited to computer supported modeling of: windows, transom windows, door windows, grates, wheels, pulleys, hubcaps, manhole covers, ornaments, etc.

BRIEF DESCRIPTION OF THE DRAWINGS

Reference will now be made to the following figures which illustrate, by way of example only, preferred embodiments of the present invention and in which.

DETAILED DESCRIPTION OF THE PREFERRED EMBODIMENTS

Figure 1:
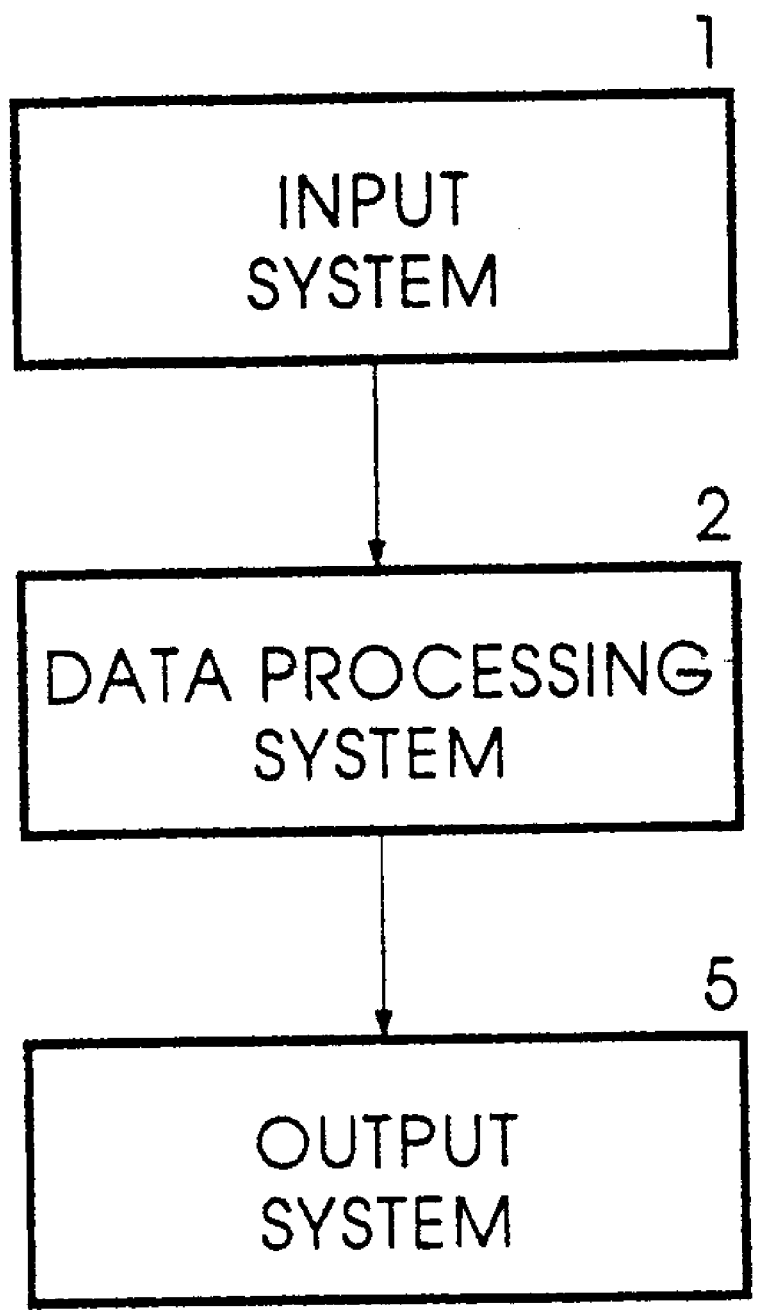
FIG. 1 is a block diagram showing a schematic arrangement of the preferred embodiment of a computer graphic modeling system of the present invention.

Before describing the specifics of the present invention, it is helpful to provide some general definitions, which are applicable to this specification. This invention is directed to a computer graphics system for modeling parametric objects having segments of an intersection of a modular matrix of rectangles and an elliptic, lenticular or rhombic segment.

An ellipse is a closed curve that can be formed by the intersection of a plane with a right circular cone.

A biconvex lentis is a lens like shape which is bounded by two arc segments which are joined by a principal axis. The principal axis is the common chord of the arc segments. Each arc segment has a geometric origin which is on the opposite side of the principal axis.

A rhombus is an equilateral parallelogram having the angles usually, but not necessarily, oblique.

A geometric boundary plane denotes an elliptic boundary plane of an elliptic or a lenticular segment or a hypothenuse of a rhombic segment.

A quarter geometric section denotes a quarter segment of an ellipse, lentis or rhombus which is bounded by two axes of symmetry and by a geometric boundary plane.

After such quarter geometric section is mirrored one time, the resulting geometric shape is a semi-elliptic, -lenticular or -rhombic segment. After such quarter geometric section is mirrored three times, the resulting geometric shape is an ellipse, biconvex lentis or rhombus.

All references to modular matrix of rectangles include references to an orthogonal grid of evenly spaced rows and evenly spaced columns of equal rectangles. The spacing module of the rows is independent from the spacing module of the columns.

All references to objects having segments of an intersection of a modular matrix of rectangles and an elliptic, lenticular or rhombic segment indicate a reference to objects having segments of an intersection of a modular matrix of rectangles and an elliptic, lenticular or rhombic segment where the geometric origin of the elliptic, lenticular or rhombic segment is used as the coordinating local origin of the segments of the intersection. It will be appreciated by those skilled in the art that any reference point could be chosen as local origin, but reference points other than the geometric origin require additional transformations. In this disclosure, all geometric descriptions are relative to an orthogonal Cartesian computer coordinate system. The local coordinate system of segments of an intersection of a modular matrix of rectangles and an elliptic, lenticular or rhombic segment may be rotated or translated.

All references to intersection segments indicate a reference to segments of an intersection of a modular matrix of rectangles and an elliptic, lenticular or rhombic segment.

Shape grammars are a set of rules to evaluate and specify geometrical attributes and relationships. For example the preferred invention checks that no invalid and no undesirable geometries occur.

The direction of the +X axis is east. The direction of the +Y axis is north. All references to "east" indicate a relative position in the +X axis direction. All references to "west" indicate a relative position in the −X axis direction. All references to "north" indicate a relative position in the +Y axis direction. All references to "south" indicate a relative position in the −Y axis direction.

A reference to an axis as axis of symmetry is a reference to an actual axis of symmetry or to an axis with the latent potential to be an axis of symmetry if the referenced segment were mirrored to form a complete ellipse, lentis or rhombus.

The axes of symmetry of the ellipse and the rhombus coincide with the X axis and the Y axis of the local coordinate system and the intersection of the axes of symmetry coincides with the local origin of the local coordinate system. The lentis has two local coordinate systems which are offset from the intersection of the axes of symmetry.

It will be appreciated by those skilled in the art, if the geometry of the elliptic, lenticular or rhombic segment includes more than one quarter geometric section, the geometric data of such mirrored intersection segments can be derived by transposing and storing the abscissa values and the ordinate values of the initially calculated geometric data of the segments of the intersection which are located in the +X +Y quadrant.

Unless noted otherwise, the detailed description of this disclosure is in connection with a quarter elliptic, lenticular or rhombic section.

[E] denotes pertaining exclusively to an elliptic segment.
[L] denotes pertaining exclusively to a lenticular segment.
[R] denotes pertaining exclusively to a rhombic segment.

For consistency in each Figure, similar elements are indicated with like references, unless noted otherwise.

FIG. 1 is a block diagram showing a schematic arrangement of a computer graphics modeling system of the present invention. The system includes an input sub-system 1, a data processing sub-system 2 that may comprise a computer, and an output sub-system 5 as described more fully below. It will be appreciated by those skilled in the art, and from the following descriptions that some of the processes in the data processing system can be realized by software and executed by a central processing unit such as, for example, a server, a workstation or a personal computer.

Figure 2:
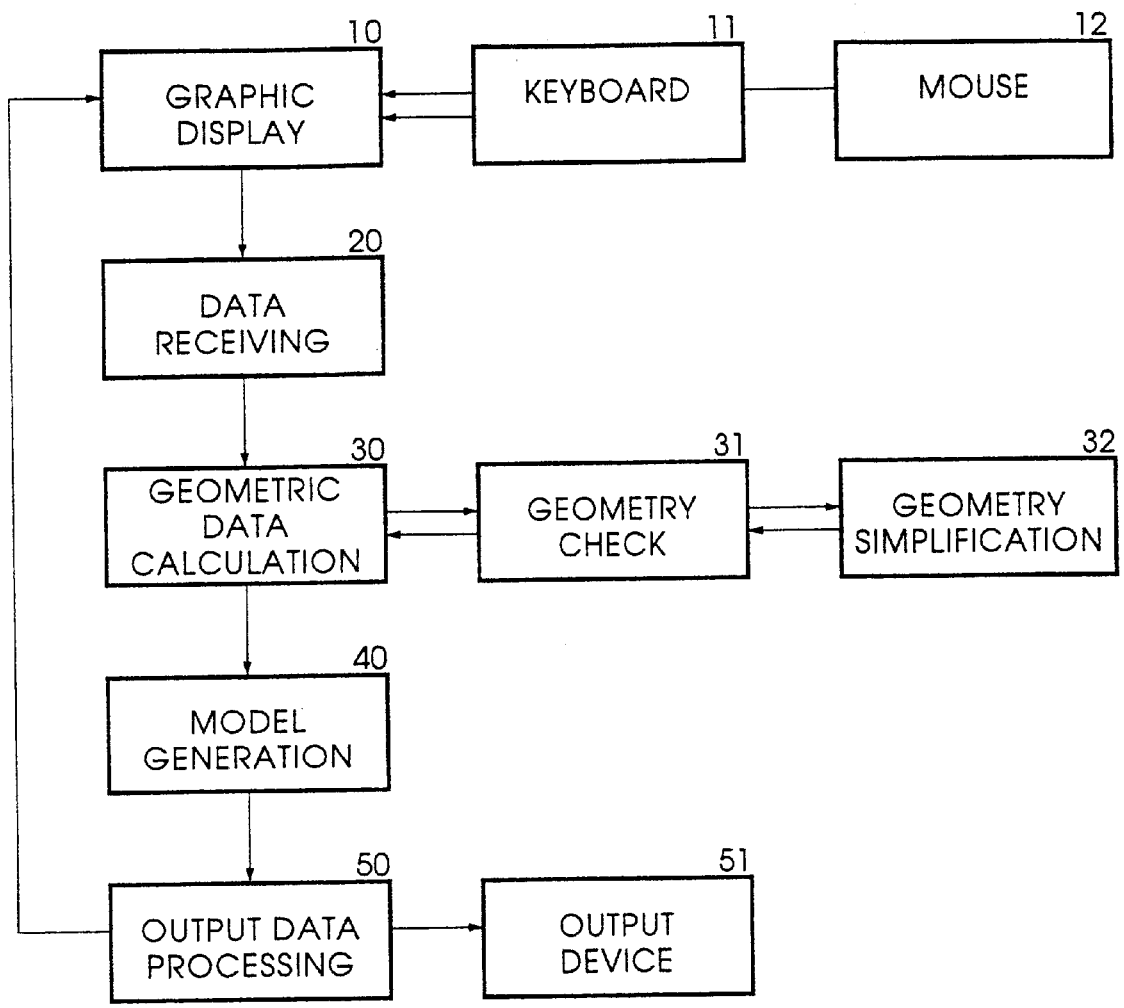
FIG. 2 is a block diagram showing a schematic arrangement of the sub-systems of the preferred embodiment of a computer graphic modeling system of FIG. 1.

FIG. 2 is a block diagram showing the schematic arrangement of FIG. 1 at a more detailed system level which illustrates elements of the three sub-systems shown in FIG. 1.

The data input sub-system 1 may consist of, but is not limited to, the following elements, a graphic display unit 10, such as a monitor, and data input devices such as a keyboard 11, and a mouse 12. The purpose of the data input subsystem is to allow data to be input into the system to facilitate real time design of the objects being designed.

The computer graphics system according to the present invention has an input and an output mode. A graphic display unit 10 displays input and output environments, for example through a window with information about an object that the user has already retrieved from a database. These environments can be alternately or concurrently displayed on the screen of the graphic display unit. In input mode the user may configure an instance of the retrieved object by editing attribute values. The object's parameters define an instance of the object. The parameters comprise the object's geometrical attributes and attribute values. Thus a given parameter set may comprise four parameter sub-sets:

parameters with attribute values that can be specified and edited by the user;

parameters with encapsulated attribute values that cannot be directly edited by the user;

parameters with attribute values that result from data exchange with other components of the object; and parameters with attribute values that result from data exchange with other objects in the computer graphic system's database.

With respect to attribute values that can be set by the user the preferred manner is to provide an input mode in which values can be entered with the keyboard 11 and/or the mouse 12 and/or graphics tablet and/or other means of transferring input values. The preferred computer graphics system displays the entered or input values on the graphic display unit 10. In a preferred output mode a graphical representation in conformity with the entered input values can be displayed.

The data processing sub-system 2 consists of the following elements:

a data receiving sub-system 20;
a geometric data calculation sub-system 30;
a model generation sub-system 40.

In the data receiving sub-system 20 the attribute values are evaluated by comparing them to ensure that no impossible geometries are proposed. If errors are detected, a warning message may be displayed on the graphic display. Each object, for example a door a window or the like, has an origin which is defined by the object syntax at the time the object is first stored in the database. The origin of the object is used in conventional programs to locate the object in the cartesian coordinate system of the computer database. According to the present invention a geometric origin 100 and 100' (FIG. 6) of the bounding geometric surface 130, i.e. elliptic arc, circular arc, hypothenuse, is calculated and a translation vector from the object's origin to the geometric origin is calculated and stored. This will be used, if necessary, to ensure the modified object is correctly located in the Cartesian coordinate system. The geometric origin 100 (FIG. 6) of the elliptic and the rhombic segment are located at the intersection of the axes of symmetry. The geometric origin 100 and 100' (FIGS. 6 and 7) of the lenticular segment is offset from the intersection of the axes of symmetry.

Figure 3:
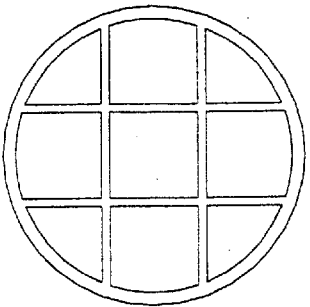
FIG. 3 is a table with orthographic projections to illustrate parametric transformations of the present invention and non-parametric transformations of the prior art.

FIG. 3 illustrates the prior art and the geometric improvements which result from this invention. It illustrates the geometric consistency of an orthogonal transformation of an elliptic, a lenticular and a rhombic segment which are parametric and the anamorphism which is the result of an orthogonal transformation of an elliptic, a lenticular and a rhombic segment which are non-parametric.

Figure 4:
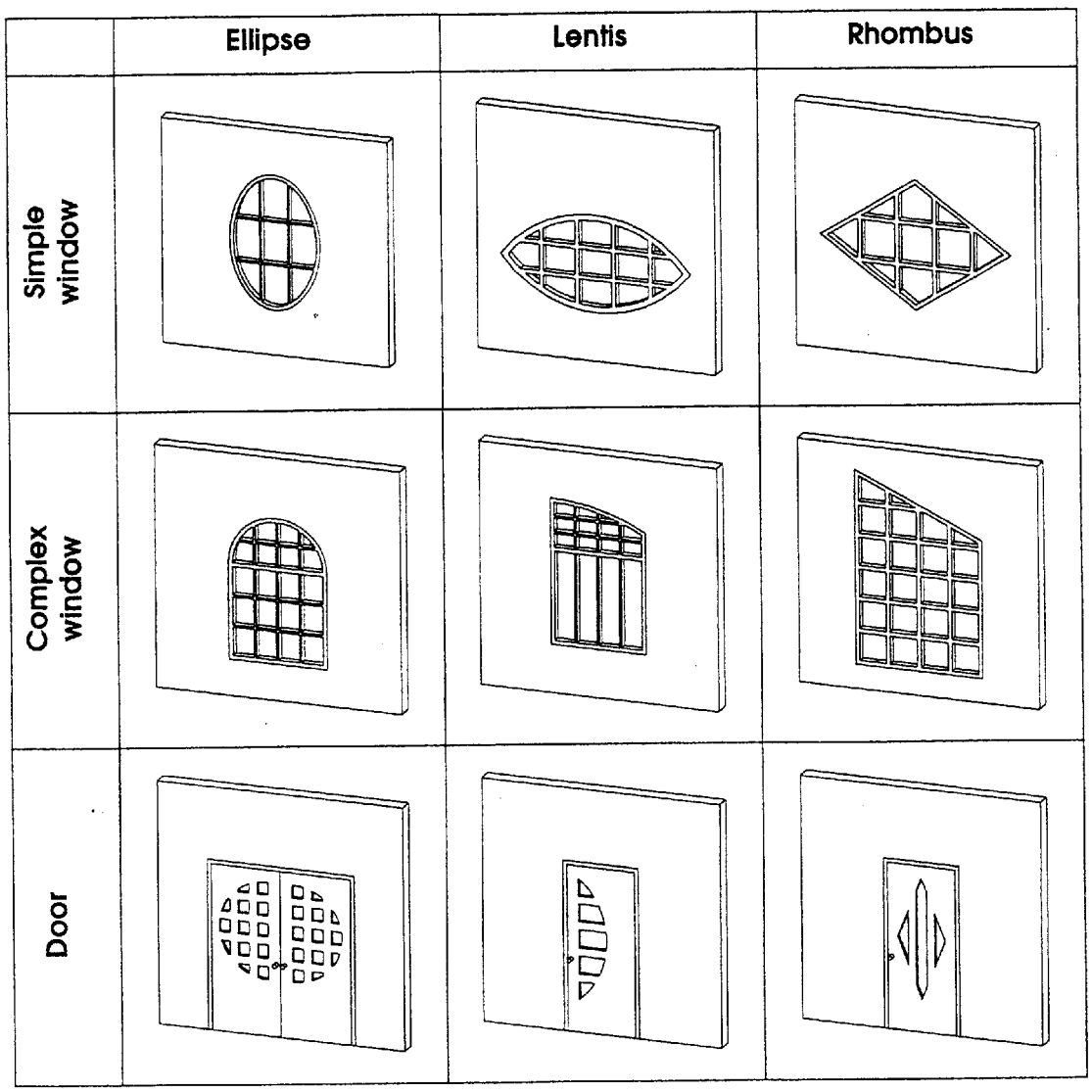
FIG. 4 is a table with isometric projections to illustrate applications of the present invention in a simple window, in a complex window and in a door.

FIG. 4 illustrates some examples from the field of application for this method which includes but is not limited to computer supported modeling of: windows, transom windows, door windows, grates, wheels, pulleys, hubcaps, manhole covers, ornaments, etc.

Figure 5:
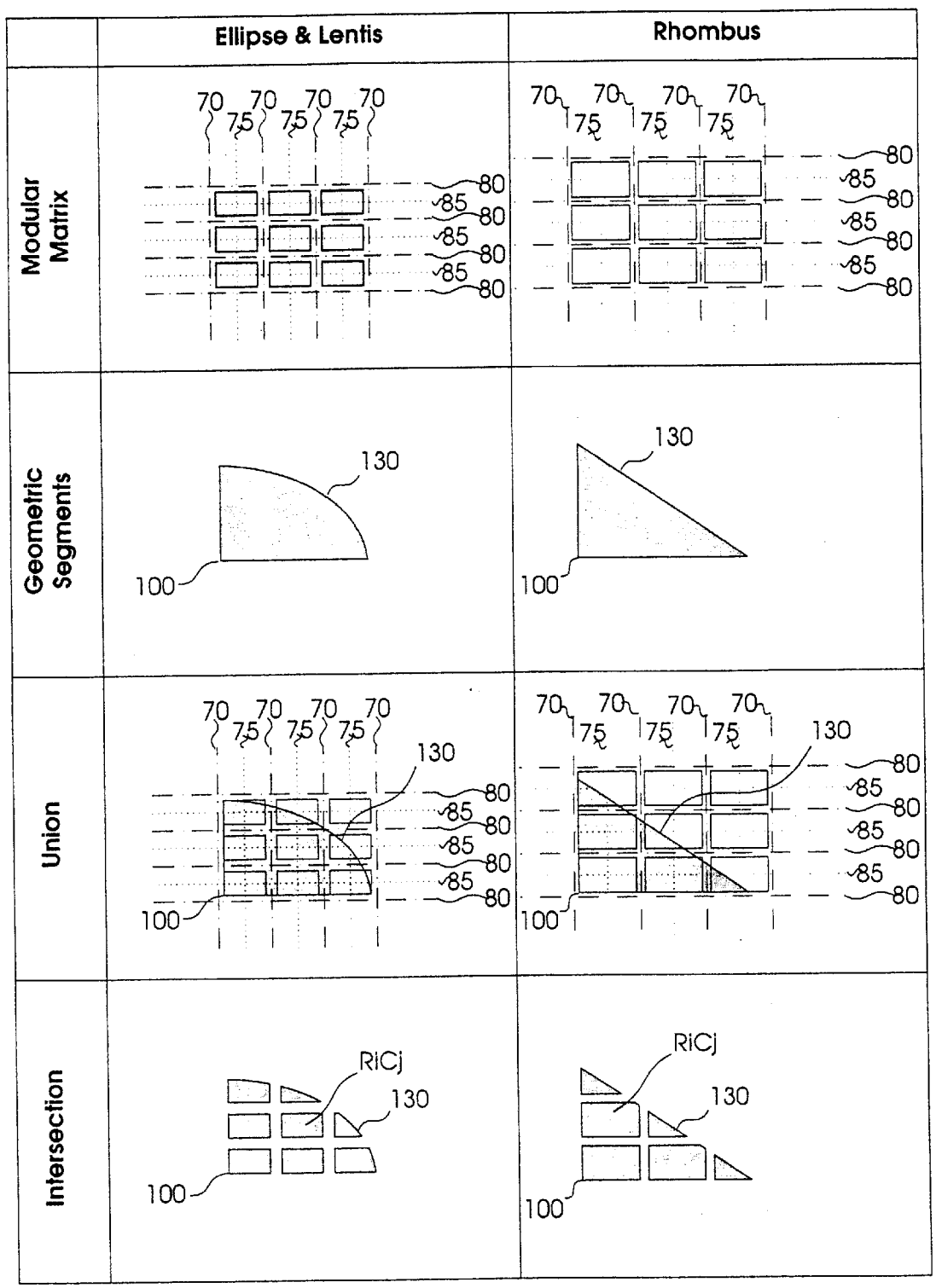
FIG. 5 is a table with orthographic projections of a modular matrix, an elliptic and a rhombic segment, a union of a modular matrix of rectangles and an elliptic and a rhombic segment; and an intersection of a modular matrix of rectangles and an elliptic and a rhombic segment.

FIG. 5 illustrates a modular matrix of rectangles and an elliptic or lenticular segment and a rhombic segment. The modular matrix of rectangles which intersects the elliptic or lenticular segment and the rhombic segment has a major grid, the matrix grid defined by gridlines 70 and 80, which is coincident with the centrelines of the space between the rows and columns of the matrix and it has a minor grid, the rectangle grid defined by gridlines 75 and 85, which is coincident with the centrelines of the rectangular segments of the matrix. The intersection segments RiCj are truncated by a geometric bounding plane 130 which is an elliptic arc or a hypothenuse of a rhombic segment.

Figure 6:
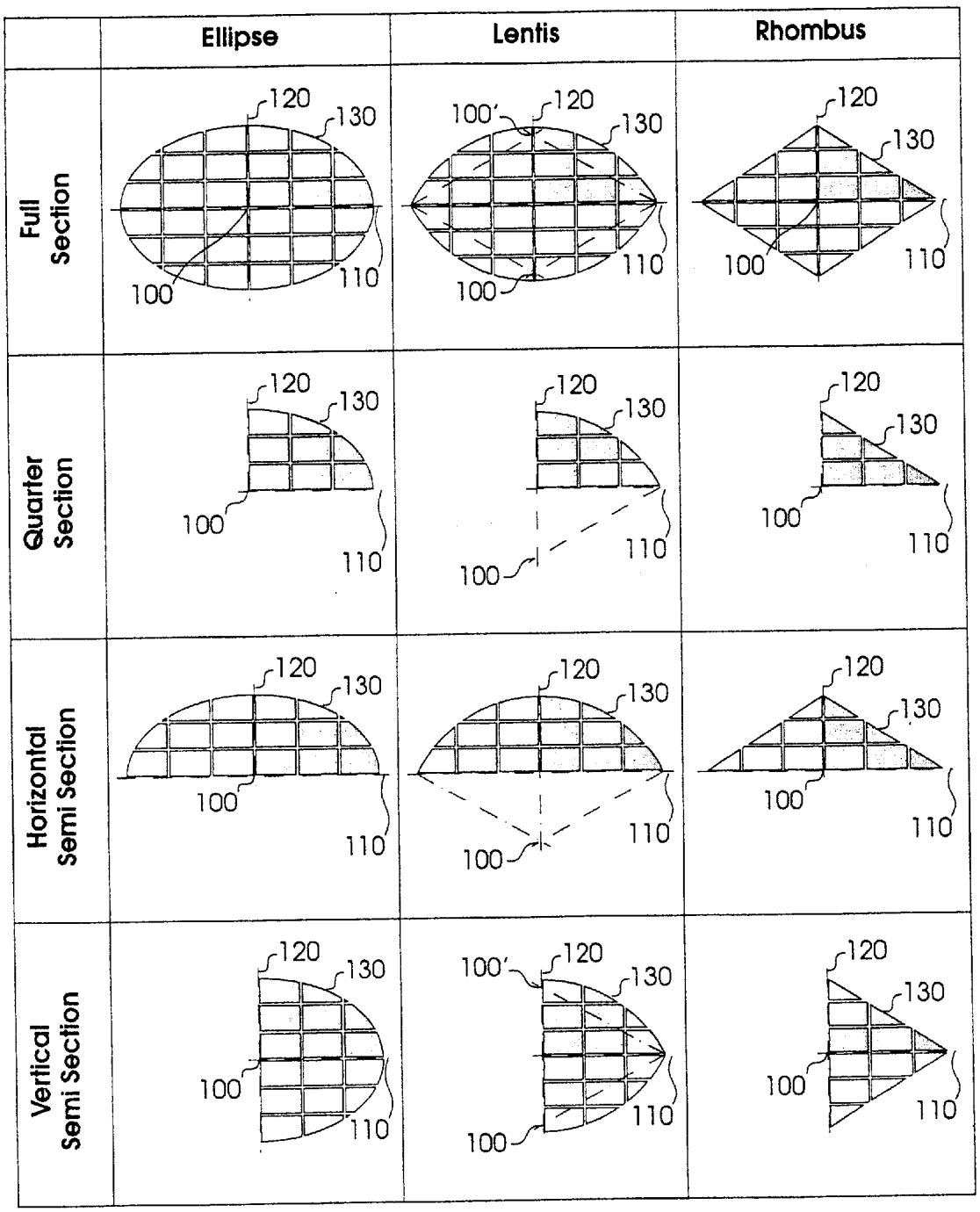
FIG. 6 is a table with orthographic projections of a full, a quarter, a horizontal semi and a vertical semi section of an ellipse, a lentis and a rhombus, including axes of symmetry and geometric origins.

FIG. 6 is a table to illustrate the axes of symmetry 110 and 120 and the relative location of the local geometric origin 100 of an elliptic segment, the local geometric origin 100 and 100' of a lenticular segment and the local geometric origin 100 of a rhombic segment. It also illustrates that only the geometric data of the intersection segments which are located in the geometric quarter section that is bounded by the +X and the +Y axes need to be calculated and evaluated. If the elliptic, lenticular or rhombic segment is an assembly of quarter sections, the geometric data of the mirrored segments of the intersection can be derived by transposing the abscissa and the ordinate values of the previously calculated vertices. When the lenticular segment constitutes more than one quadrant it may include two geometric origins which are opposite and equidistant to the principal axis of the lentis. If a lenticular quadrant is mirrored relative to the principal axis than a translation vector must be added when transposing the vertices.

Figures 7, 8:
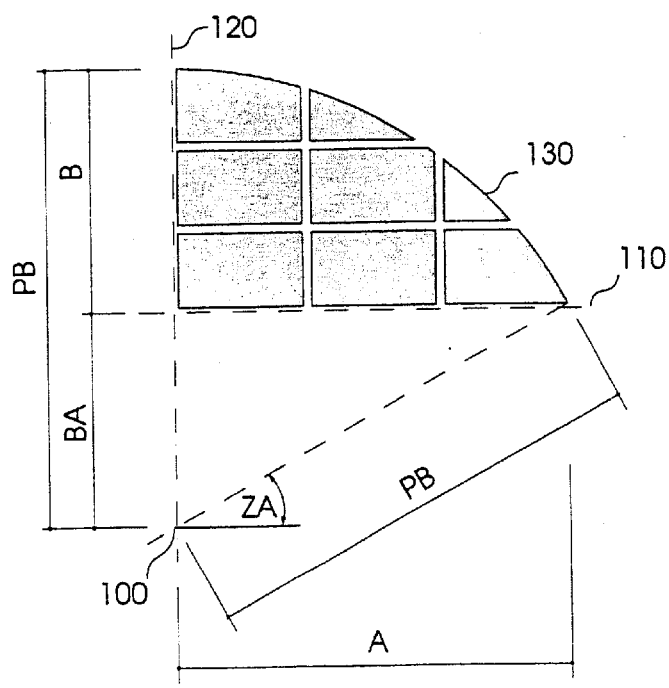
FIG. 7 is an orthographic projection to illustrate a lenticular segment, the relative location of the geometric origin and the axes of symmetry.
FIG. 8 is a table with orthographic projections to illustrate elliptic, lenticular and rhombic segments which have a relative location which is concentric or eccentric within an object.

FIG. 7 is an illustration of a lenticular segment which is a quarter section, the geometric origin 100, one axis of symmetry which is the principal axis 110, one axis of symmetry 120 which coincides with the geometric origin 100 and the bounding arc 130. This illustration will be used to explain the calculation of the translation vector between the geometric origin 100 and the intersection of the axis of symmetry. The following variables are used in this explanation:

A=length of the chord of the quarter section
B=height of the quarter section
Starting angle of the arc,
ZA=2*atan(A/B) −90
Arc radius,
PB=A*cos(ZA)
Translation vector,
BA=PB−B FIG. 8 is a table with illustrations of an elliptic, a lenticular and a rhombic intersection segment which is concentric with a larger geometrically similar object and an elliptic, a lenticular and a rhombic intersection segment which has an eccentric location within a larger object. The elliptic, lenticular and rhombic intersection segments which are concentric have an origin 100 which may coincide with the origins of the respective concentric objects. The elliptic, lenticular and rhombic intersection segments which are eccentric have an origin 100 which may not coincide with the origins of the objects and may require a translation vector to coordinate its location inside the object.

Figure 9:
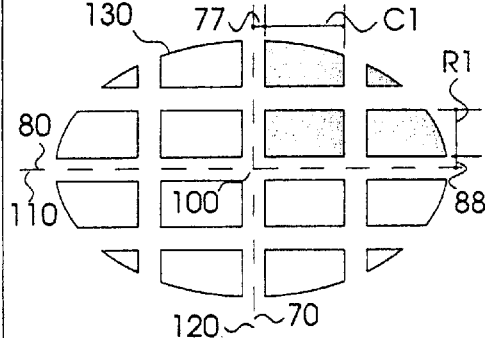
FIG. 9 is a table with orthographic projections of an elliptic or lenticular segment and of a rhombic segment where the axes of symmetry coincide with either the matrix grid or the centrelines grid of the rectangles.

FIG. 9 is a table to illustrate the axes of symmetry 110 and 120, and the relative location of the matrix grid 70, 80 and the rectangular grid 75, 85. The 4 geometries are the result of either of the matrix grids and/or either of the rectangle grids being coincident with either axis of symmetry, 110 and 120, of the elliptic, lenticular or rhombic segment. To relate the orthogonal lattice to the origin of the bounding elliptic arc element, a translation vector with abscissa 77 and ordinate 88 must be calculated. When the segment is lenticular the translation vector BA must be added also. The intersection segments which are located in the +X +Y quarter section in whole or in part are shaded to illustrate their geometric relationships with the axes of symmetry.

Figure 10:
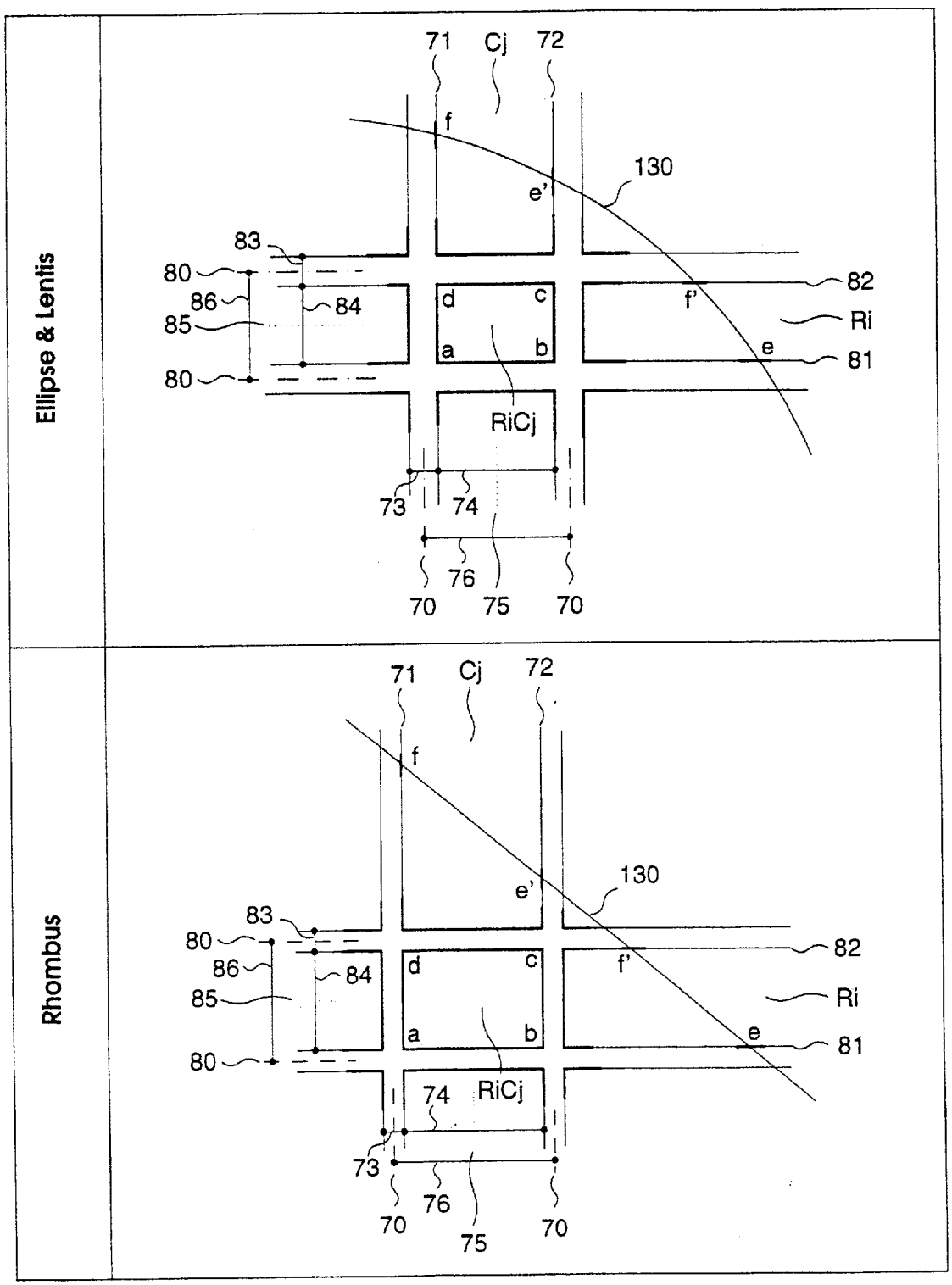
FIG. 10 is a table with orthographic projections of a rectangular segment with an elliptic or lenticular arc and with a rhombic hypotenuse.

FIG. 10 is a table to illustrate the intersection of a row Ri and a column Cj of a rectangular segment RiCj of a modular matrix and a geometric bounding plane 130, an elliptic arc or a rhombic hypotenuse. The rectangular segment has a south west vertex a, south east vertex b, north east vertex c and north west vertex d. The geometric bounding plane 130 intersects the south plane 81 of row Ri at vertex e and the north plane 82 at vertex f. The geometric bounding plane 130 intersects the west plane 71 of column Cj at vertex f and the east plane 72 at vertex e'.

Figure 11:
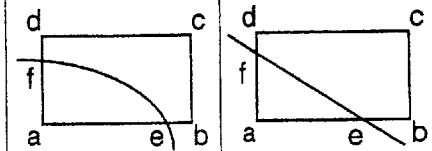
FIG. 11 is a table to tabulate the 5 possible geometries of the segments of an intersection.
Figure 11:
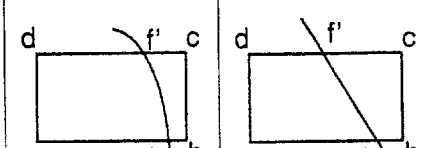
Figure 11:
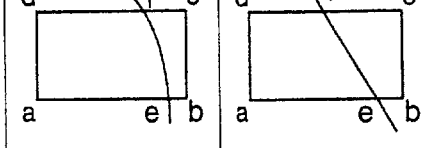
Figure 11:
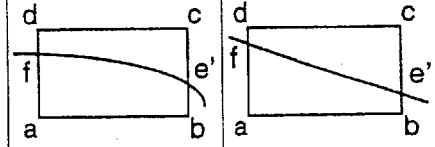
Figure 11:
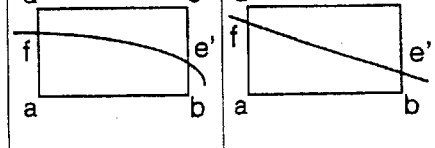
Figure 11:
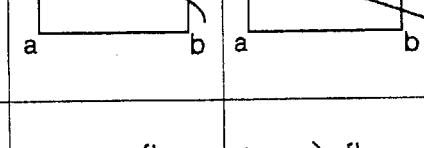
Figure 11:
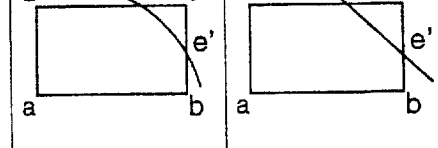
Figure 11:
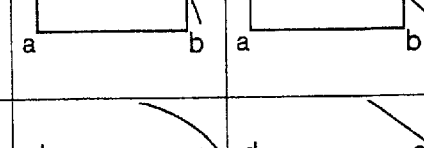
Figure 11:
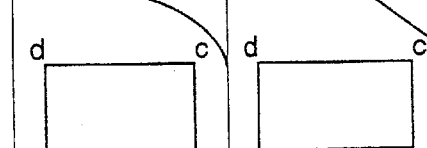
Figure 11:
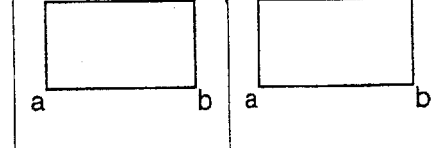

FIG. 11 is a table to schematically tabulate 5 principal geometric conditions of an intersection segment RiCj which may be truncated by a geometric bounding plane 130. The typology of the boundary geometries are referenced in FIG. 12. A maximum of 12 geometric data calculations and evaluations are required for an intersection segment. Now referring to FIGS. 10 and 11, first a row Ri and column Cj of rectangular segments is intitialized relative to the geometric origin 100:

the ordinate of the south boundary plane 81 and the north boundary plane 82 are calculated and, the abscissa of the west boundary plane 71 and the abscissa of the east boundary plane 72 are calculated. Now referring to FIGS. 10 and 11 the geometric data of an intersection segment RiCj is calculated.

In calculation 1, the geometric data for vertex a, the intersection of the west boundary plane 71 and the south boundary plane 81, is calculated and stored.

In calculation 2, the geometric data for vertex e, the intersection of the geometric bounding plane 130 and the south boundary plane 81 of the interstitial segment RiCj, is calculated.

Calculation 3 is a shape grammar. The abscissa of vertex e is compared with the abscissa of vertex b, the intersection of the east boundary plane 72 and the south boundary plane 81. If the abscissa of vertex e is less than the abscissa of vertex b it is a type 1 or 2 geometry else it is a type 3, 4 or 5 geometry.

In calculation 4, if it is a type 1 or 2 geometry than the geometric data for vertex e is calculated and stored, else if it is a type 3, 4 or 5 geometry then the geometric data for vertex b is calculated and stored.

In calculation 5, if it is a type 3, 4 or 5 geometry than the geometric data for vertex e', the intersection of the geometric bounding plane 130 and the east boundary plane 72 of the intersection segment RiCj, is calculated.

Calculation 6 is a shape grammar. The ordinate of vertex e' is compared with the ordinate of vertex c, the intersection of the east boundary plane 72 and the north boundary plane 82. If the ordinate of vertex e' is less than the ordinate of vertex c it is a type 3 or 4 geometry, else it is a type 5 geometry.

In calculation 7, if it is a type 3 or 4 geometry than the geometric data for vertex e' is calculated and stored, else if it is a type 5 geometry than the geometric data for vertex c is calculated and stored. In calculation 8, if it is a type 5 geometry the geometric data for vertex d, the intersection of the west boundary plane 71 and the north boundary plane 82, is calculated and stored. The calculation of the geometric data for this intersection segment RiCj is completed and the next intersection segment can be calculated. If it is a type 1, 2, 3, or 4 geometry than the geometric data for vertex f, the intersection of the geometric bounding plane 130 and the west boundary plane 71 of the intersection segment RiCj, is calculated.

Calculation 9 is a shape grammar. The ordinate of vertex f is compared with the ordinate of vertex d. If the ordinate of vertex f is less than the ordinate of vertex d it is a type 1 or 3 geometry, else it must be a type 2 or 4 geometry.

In calculation 10, if it is a type 1 or 3 geometry the geometric data for vertex f is calculated and stored. The calculation of the geometric data for this intersection segment RiCj is completed and the next intersection segment can be calculated. If it is a type 2 or 4 geometry then the geometric data for vertex d is calculated and stored.

Calculation 11, is for a type 2 or 4 geometry. The geometric data for vertex f', which is at the intersection of the geometric bounding plane 130 and the north boundary plane 82 of the intersection segment RiCj, is calculated.

In calculation 12, the geometric data for vertex f' is calculated and stored. The calculation of the geometric data for this intersection segment RiCj is completed and the next intersection segment can be calculated.

Before the next intersection segment is calculated, the width and the length of the calculated intersection segment is evaluated. If the width or the length is less than a specified value, the geometric data of the evaluated intersection segment are invalid and are deleted from the database. This evaluation is a shape grammar which I will refer to as the Gijsbertus Langelaan shape grammar.

Figure 12:
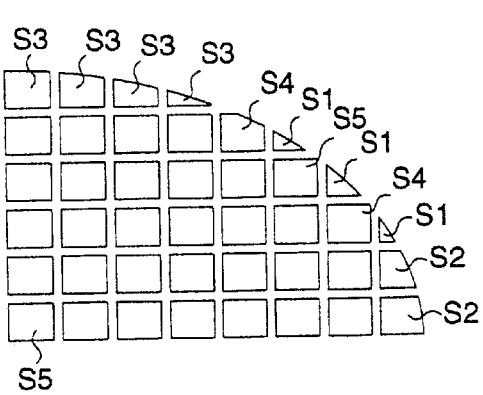
FIG. 12 is a table with orthographic projections to illustrate dimensionally un-restricted and dimensionally restricted segments of an intersection, where the segments are labelled in conformity with the taxonomy of FIG. 11.

FIG. 12 is a table to illustrate a taxonomy of the intersection segments. Furthermore it illustrates a result of the Gijsbertus Langelaan shape grammar to dimensionally restrict truncated intersection segments of an elliptic and a rhombic segment.

In the geometric calculation sub-system 30 of FIG. 2, geometric data is calculated and stored in a database for processing in the model generation sub-system 40. Two sets of geometric data are calculated:

geometric data for the geometry of the object excluding the intersection segments; and geometric data of the object's intersection segments.

For example, referring to FIG. 8, the first set of data would be the perimeter of the larger object and the second set of data would be for the intersection segments.

The model generation sub-system 40 uses the stored geometric data of the object and its intersection segments to generate a 2D or 3D model, and may calculate a projection of the entire model or of a detail. In addition the projection may include but is not limited to attributes for colour, texture mapping, shadow casting, light emission, transparency, luminosity, or other features of illustration as are known to those skilled in the art.

Turning back to FIG. 2, the output system 5 consists of the following elements:

output data processing sub-system 50;

graphic display unit 10;

output devices 51.

In the output data processing sub-system 50 the projected model and its attributes are compiled into a format which is suitable for interpretation by the output device.

The output devices 51 may consist of, but are not limited to a graphic display, a printer, a plotter, a NC machining or manufacturing device, a stereo lithographer, a data storage system, or the like.

Figure 13:
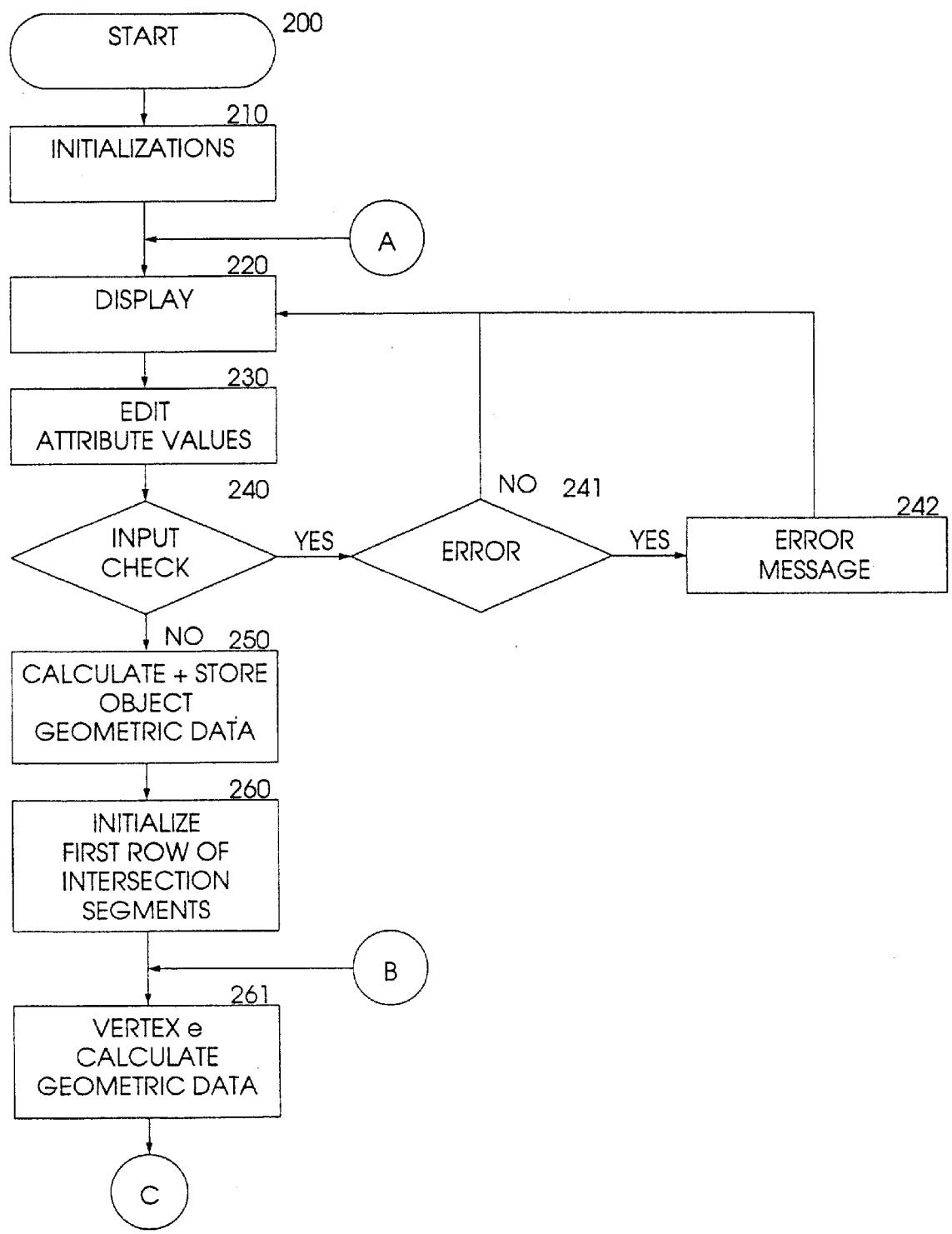
FIG. 13 is a schematic flowchart for a method for modeling objects which include segments of an intersection of a modular matrix of rectangles and an elliptic, lenticular or rhombic segment.
Figure 14:
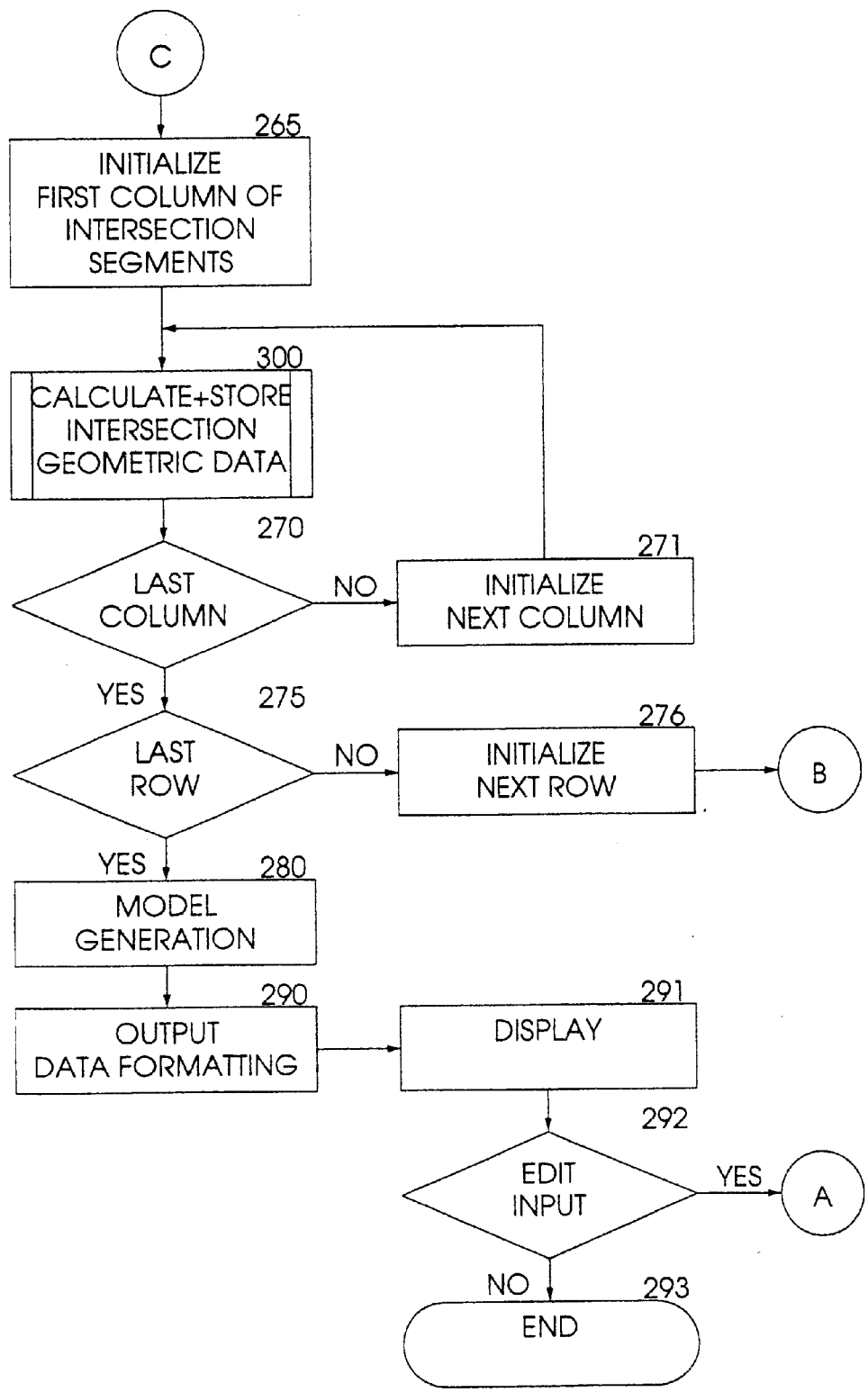
FIG. 14 is a continuation of the flowchart of FIG. 13.
Figure 15:
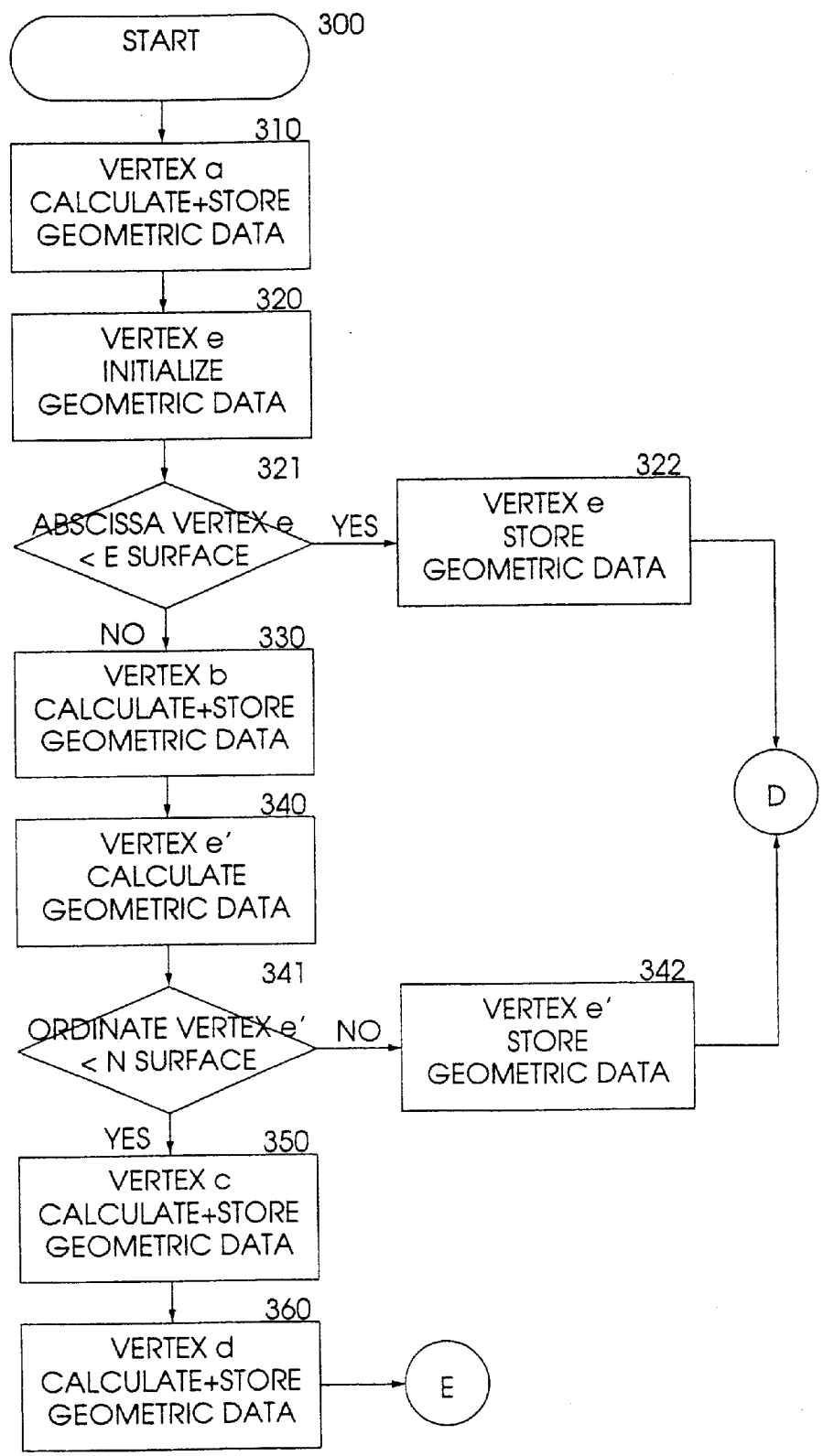
FIG. 15 is a schematic flowchart for a method for calculating geometric data for segments of an intersection of a modular matrix of rectangles and an elliptic, lenticular or rhombic segment.
Figure 16:
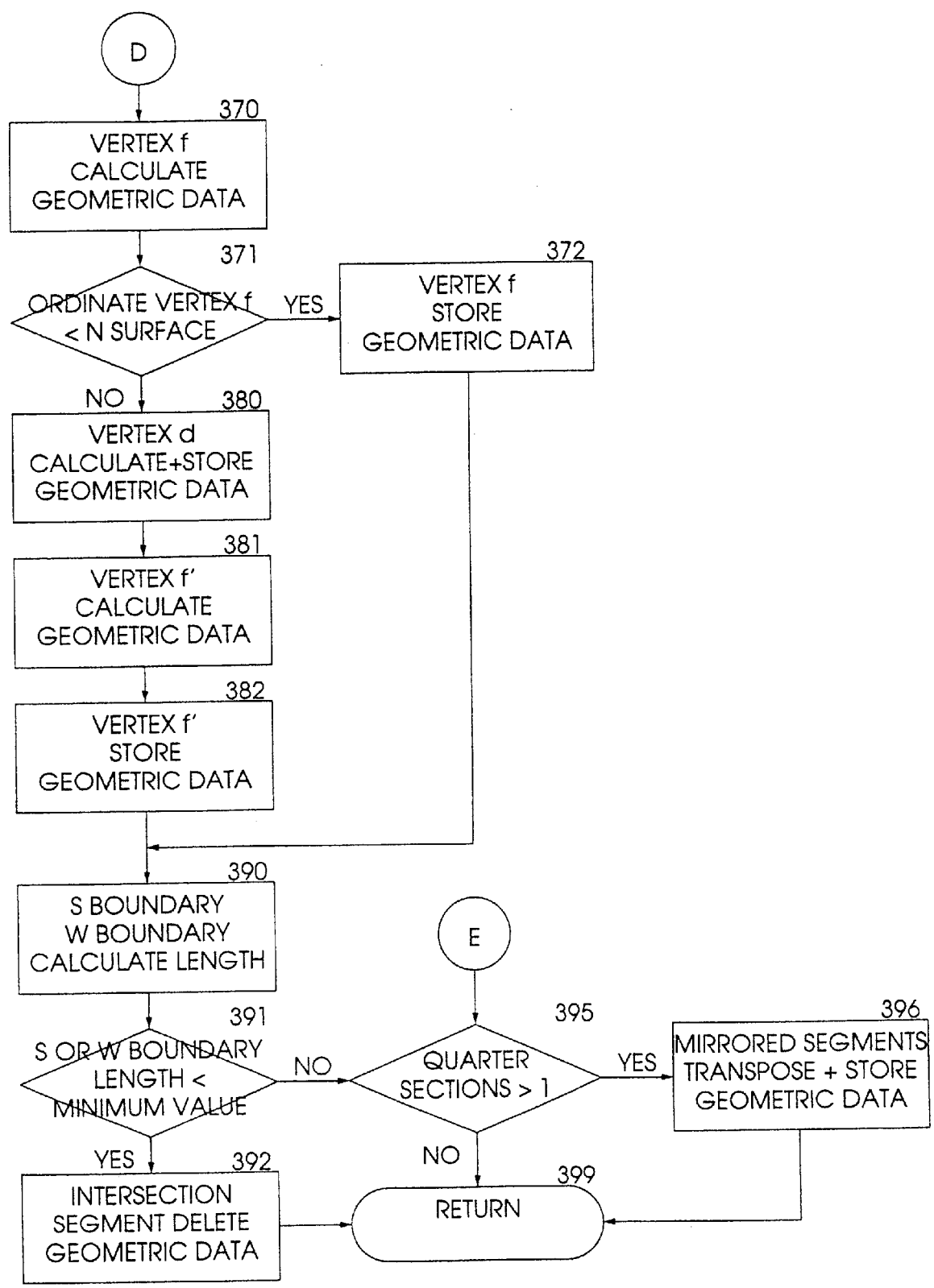
FIG. 16 is a continuation of the flowchart of FIG. 15.

FIG. 13, and its continuation in FIG. 14 is a schematic flowchart for modeling objects which include segments of an intersection of a modular matrix of rectangles and an elliptic, lenticular or rhombic segment according to the present invention. FIG. 15 and its continuation in FIG. 16 is a schematic flowchart to explain the calculation of the geometric data for the segments of an intersection of a modular matrix of rectangles and an elliptic, lenticular or rhombic segment.

The following variables are used in the explanation (see FIGS. 7, 9, 10),

A=length of the +X chord of a quarter geometric section

A'=length of the elliptic, lenticular or rhombic segment,

B=width of the +Y chord of a quarter geometric section

B'=width of the elliptic, lenticular or rhombic segment,

AC=matrix east-west grid module 76,

AD=width 74 of columns Cj of intersection segments RiCj

[L]BA=distance from the geometric origin of the lenticular arc to the chord of the lenticular segment, BB=ordinate 88 of the south boundary plane 81 of the first row of intersection segments, BC=matrix north-south grid module 86, BD=width 84 of columns Ri of intersection segments RiCj, C1=column number 1, the first column of intersection segments which are calculated, Cj=column number j of intersection segments, DA=abscissa 77 of the west boundary plane 71 of the first column Cj of intersection segments RiCj, H=width 73 between the columns, HH=width 83 between the rows, I=number of columns Cj of intersection segments RiCj of the elliptic segment, J=number of rows Ri of intersection segments RiCj of the elliptic segment,

[E][R]PA=east-west radius of the quarter elliptic or rhombic segment,

[L]PA=radius of the quarter lenticular segment,

PB=ordinate of the northerly limit of the quarter elliptical, lenticular or rhombic segment, R1=row number 1, the first row of intersection segments which are calculated Ri=row number i of intersection segments, RiCj=intersection segment which is located in row i and in column j, V=minimum width or height of intersection segment (not shown on drawings), X=abscissa of west boundary plane 71 of column Cj of intersection segment RiCj, XX=abscissa of east boundary plane 72 of column Cj of intersection segment RiCj, XY=abscissa of the intersection of the south boundary plane 81 and the geometric bounding segment 130, Y=ordinate of south boundary plane 81 of row Ri of intersection segment RiCj, YY=ordinate of north boundary plane 82 of row Ri of intersection segment RiCj,

[E][L]ZA=angle of the radial PA to the intersection e of the south boundary plane 81 and the arc segment 130.

[R]ZA=B/A

[R]ZC=A/B

With the following variables please refer to FIG. 10 for the relative location of vertices a, b, c, d, e, e', f and f', XA=abscissa of vertex "a" of an interstitial segment, YA=ordinate of vertex "a" of an interstitial segment, XB=abscissa of vertex "b" or "e" of an interstitial segment, YB=ordinate of vertex "b" or "e" of an interstitial segment, XC=abscissa of vertex "c" or "e'" of an interstitial segment, YC=ordinate of vertex "c" or "e'" of an interstitial segment,

[E][L]ZC=angle of polar vector to vertex "e" or "e'" of an intersection segment, XD=abscissa of vertex "d" or "f" of an intersection segment, YD=ordinate of vertex "d" or "e" of an intersection segment,

[E][L]ZD=angle of polar vector to vertex "f" or "f'" of an intersection segment, XE=abscissa of vertex "f" of an intersection segment,
YE=ordinate of vertex "f" of an intersection segment,
Xn=abscissa of vertex n of an intersection segment,
XTn=transposed abscissa of east-west mirrored vertex n of an intersection segment,
Yn=ordinate of vertex n of an intersection segment,
YTn=transposed ordinate of north-south mirrored vertex n of an intersection segment.

Each of the method steps are described in more detail below.

FIG. 13, begins with a step 200.

Step 210, represents the retrieval of an object and its user interface, which may include a display of attribute values for object.

Step 220, represents the step of displaying the user interface on the graphic display screen.

Step 230, represents the step of a user entering and/or editing attribute values for the object.

In step 240, there is provided an initial input checking step to ensure attribute values describe a real (and not impossible) geometry, after which the dataflow continues at step 241. If there is not such a calculation, then one proceeds to step 250.

In step 241, the attribute values are checked and if an error is detected then the dataflow continues to step 242. If no error is detected, then the method proceeds to step 220.

In step 242, an error message is initialized and displayed on the graphic display screen. This will prompt the user to check and reenter attribute values which are possible.

In step 250, (since the object has already been checked to be geometrically possible) the geometric data of the object, excluding the intersection segment, is calculated and stored. This includes the geometric data of, the contour of the object, the major and the minor chords of the quarter geometric segment, the origin 100 of the elliptic, lenticular or rhombic segment 130, the modules 76 and 86 of the orthogonal lattice grid, the length 74 and width 84 of the rectangular segments, the location of the matrix grid relative to the origin 100 of the elliptic or lenticular arc 130 or the rhombic hypotenuse 130.

Step 260 is the first step in a loop to sequentially initialize all rows Ri of intersection segments. The ordinate of the south boundary 81 and the ordinate of the north boundary 82 are calculated.

The start value of the loop is the ordinate 88 of the south boundary 81 of the first row Ri of intersection segments which is,

Y=BB.

The end value of the loop is PB.

The step value of the loop is the north-south grid module 86,

BC=(B'+HH)/J

The width 84 of the row Ri of intersection spaces is,

BD=BC−HH

The ordinate of the north boundary 82 of the row Ri of intersection segments is,

Y=Y+BD

In step 261, vertex e which is the intersection of the south boundary 81 and the elliptic or lenticular arc 130 or the rhombic hypotenuse 130 is calculated. This value is the limit value in the loop to sequentially analyze all columns Cj of rectangular segments which are within the boundary of the quarter geometric section's elliptic or lenticular arc 130 or the rhombic hypotenuse 130.

[E][L] The angle of the polar vector of vertex e is,

[E][L]ZA=asin(Y/PB).

The abscissa of vertex e is,

[E][L]XY=PA*cos(ZA)

[R]XY=PA−Y*ZC

FIG. 14 is the continuation of the schematic flowchart from FIG. 13, and begins with a step 265.

The step 265 is the first step in a loop to sequentially initialize all columns Cj of intersection segments. The abscissa of the east boundary 71 and the abscissa of the west boundary 72 are calculated.

The start value of the loop is the abscissa 77 of the west boundary 72 of the column Cj of intersection segments which is,

X=DA.

The end value of the loop is XY.

The step value of the loop is the east-west grid module 76,

AC=(A'+H)/I.

The width 74 of the column Cj of intersection segments is,

AD=AC−H.

The abscissa of the east boundary 72 of the column CJ of intersection segments is,

XX=X+AD

In step 300, the geometric data for the intersection segments RiCj is calculated and stored. The dataflow of this step is explained in more detail below in association with FIG. 15 and FIG. 16.

If in step 270 the intitialized column Cj is the last column then the program continues at step 275 else it continues at step 271.

In step 271 for the next column Cj the abscissa of the east boundary 72 and the abscissa of the west boundary 71 are calculated. The program continues at step 300.

If in step 275 the intitialized row Ri is the last row then the program continues at step 280 else the program continues at step 276.

In step 276 for the next row Ri the ordinate of the south boundary plane 81 and the ordinate of the north boundary plane 82 are calculated. The program continues at step 261.

In step 280 upon completion of the calculation of the geometric data for all intersection segments RiCj, all geometric data is retrieved and merged with syntactic element (s) to model an object which includes segments of an intersection of a modular matrix of rectangles and an elliptic, lenticular or rhombic segment.

In step 290 the model data is compiled for display and/or for use by other output devices.

In step 291 the model is displayed on the graphic display.

In step 292, if the model requires editing of the object then the dataflow continues at step 220 else the method is terminated.

We now turn to FIG. 15 and its continuation in FIG. 16 which is a schematic flowchart to explain the calculation of the geometric data for the segments of an intersection of a modular matrix of rectangles and an elliptic, lenticular or rhombic segment.

In step 310, the geometric data of vertex a is calculated and stored. The abscissa of vertex a, XA=max(0,X).

The ordinate of vertex a,
[E][R]YA=max(0,Y).
[L]YA=max(BA,Y).

In step 320, the geometric data of vertex e is retrieved. Vertex e is the intersection of the elliptic or lenticular arc or rhombic hypotenuse 130 and the south boundary plane 81 of the row Ri of intersection segments.
[E][L] The angle of the polar vector of vertex e,
[E][L]ZC=ZA.
The abscissa of vertex e,
XB=XY.
The ordinate of vertex e,
YB=YA.

In step 321, if the abscissa of vertex e is less than the abscissa of the east boundary plane 72 of the intersection segment RiCj, than vertex e exists, vertices b and e' do not exist, and the dataflow continues with step 322, else vertex e is outside the west boundary of the intersection segment and it's geometric data is deleted and vertex b exists.

In step 322, the geometric data of vertex e is stored and the dataflow continues in FIG. 16 with step 370.

In step 330, the geometric data of vertex b is calculated and stored. The abscissa of vertex b,
XB=XX.
The ordinate of vertex b,
YB=YA.

In step 340, the geometric data of vertex e' is calculated. Vertex e' is the intersection of the geometric boundary plane 130 and the east boundary plane 72 of the column Cj of intersection segments.
[E][L] The angle of the polar vector to vertex e' is,
[E][L]ZC=acos(XX/PA).
The abscissa of vertex e' is,
XC=XX.
The ordinate of vertex e' is,
[E][L]YC=PB*sin(ZC)
[R]YC=(PA-XC)*ZA.

In step 341, if the ordinate of vertex e' is less than the ordinate of the north boundary plane 82 of the intersection segment RiCj, than vertex e' exists, vertex c does not exist, and the dataflow continues with step 342, else vertex e' is outside the boundary of the intersection segment and it's geometric data is deleted,
XC=0,
YC=0,
ZC=0,
and the calculation continues with step 350.

In step 342, the geometric data of vertex e' is stored, and the dataflow continues in FIG. 16 with step 370.

In step 350, the geometric data of vertex c is calculated and stored. The abscissa of vertex c,
XC=XX.
The ordinate of vertex c,
YC=YY.

In step 360, the geometric data of vertex d is calculated and stored. The abscissa of vertex d,
XD=XA.
The ordinate of vertex d,
YD=YY.

This intersection segment is a rectangle and the geometric data of its 4 vertices are now calculated and stored. The dataflow continues in FIG. 16 with step 395.

We now continue with the continuation of step 322 or step 342 in FIG. 16 with step 370.

In step 370, the geometric data of vertex f is calculated. Vertex f is the intersection of the geometric bounding plane 130 and the west boundary plane 71 of the column Cj of intersection segments.
[E][L] The angle of the polar vector to vertex f is,
[E][L]ZD=acos(XA/PA).
The abscissa of vertex f is,
XD=XA.
The ordinate of vertex f is,
[E][L]YD=PB*sin(ZD)
[R]YD=(PA-XD)*ZA In step 371, if the ordinate of vertex f is less than the ordinate of the north boundary plane 82 of the intersection segment RiCj, than vertex f exists, vertex d does not exist, and the dataflow continues with step 372, else vertex f is outside the boundaries of the intersection segment RiCj and it's geometric data is deleted,
XD=0,
YD=0,
ZD=0, and the calculation continues with step 380.

In step 372, the geometric data of vertex f is stored, and the dataflow continues with step 390.

In step 380, the geometric data of vertex d is calculated and stored. The abscissa of vertex d,
XD=XA.
The ordinate of vertex d,
YD=YY.

In step 381, the geometric data of vertex f' is calculated. Vertex f' is the intersection of the geometric boundary plane 130 and the north boundary plane 82 of the row Ri of intersection segments.
[E][L] The angle of the polar vector to vertex f' is,
[E][L]ZD=asin(YY/PB).
The abscissa of vertex f' is,
[E][L]XE=PA*cos(ZD)
[R]=(PB - YE)*ZC
The ordinate of vertex f' is,
YE=YY.

In step 382, the geometric data of vertex f' is stored.

This intersection segment RiCj is bounded by an elliptic arc 130 or a rhombic hypotenuse 130 and the geometric data of its vertices are now calculated and stored.

In step 390, the length and width of the intersection segment that is bounded by an elliptic arc or a rhombic hypotenuse are calculated.
The length is,
L=XY-X.
The width is,
W=YD -Y.

In step 391 the length and the width of the intersection segment are evaluated. If the length or the width is less than the specified value V, than the dataflow continues with step 392, else the dataflow continues with step 395.

In step 392, the geometric data of the intersection segment is deleted, and the dataflow continues with step 399.

In step 395, the geometry of the elliptic, lenticular or rhombic segment is evaluated. If the geometric segment includes axes of symmetry than the dataflow continues with step 396, else the dataflow continues with step 399.

In step 396, the geometric data of the intersection segment is transposed to calculate and store additional geometric data for mirrored intersection segments. To mirror from east to west, relative to the Y axis of symmetry, the abscissa of each datum point is transposed as, XTn=−Xn.

To mirror from north to south, relative to the X axis of symmetry, the ordinate of each datum point is transposed as,

[E][R]YTn=−Yn

[L]YTn=2*BA −Yn

In step 399, the calculation returns to FIG. 34 and step 270 to initialize the next intersection segment if applicable.

It will be appreciated by those skilled in the art that various modifications and alterations can be made to the present invention without departing from the broad scope of the invention as defined by the attached claims. Some of these modifications have been discussed above, and others will be apparent to those skilled in the art. For example, while reference is made herein to a program, it will be appreciated that any hardware platform would be appropriate provided it has sufficient computational power and memory.

I claim:

1. A computer graphics system for parametric modelling of segmented objects, said system comprising:

means for defining a modular matrix comprising rectangles which include boundary surfaces, said boundary surfaces intersecting at vertices;

means for defining at least one of an elliptic, lenticular and rhombic segment;

means to define mean for defining a common origin for said matrix and said at least one segment; and intersecting means in communication with said defining means for intersecting said matrix with said at least one segment, said intersecting means comprising:

means for relating said vertices to said common origin to define a location of each of said vertices relative to said at least one segment;

evaluating means in communication with said relating means for evaluating said defined locations of said vertices to identify valid ones of said vertices; and determining means in communication with said evaluating means for determining the boundary surfaces of individual segments in accordance with said valid vertices.

2. A computer graphics system as claimed in claim 1 wherein said system further comprises:

a user interface for permitting a user to set one or more attribute values for said segmented object and wherein said relating means is configured to calculate said location of said vertices in light of at least said set values.

3. A computer graphics system as claimed in claim 1 wherein said intersecting means further comprises means for defining the boundary surfaces of a row of rectangular segments of the intersection.

4. A computer graphics system as claimed in claim 1 wherein said intersection means further comprises means for defining the boundary surfaces of a column of rectangular segments of the intersection.

5. A computer graphics system as claimed in claim 1 wherein said evaluating means comprises means for comparing said defined vertices to a set of geometric rules to identify invalid vertices.

6. A computer graphics system as claimed in claim 5 wherein said evaluating means further comprises means for deleting said invalid vertices.

7. A computer graphics system as claimed in claim 1 wherein said intersecting means comprises means for comparing the defined locations of the vertices to a set of geometric rules to identify any undesired segments.

8. A computer graphics system as claimed in claim 7 wherein said means for comparing is configured to discard said undesired segments.

9. A computer graphics system as claimed in claim 1 wherein said intersecting means comprises means for warning a user of any invalid geometries.

10. A computer-based method for parametric modelling of segmented objects, said method comprising the steps of:

defining a modular matrix comprising rectangles which include boundary surfaces, said boundary surfaces intersecting at vertices;

defining at least one of an elliptic, lenticular and rhombic segment;

defining a common origin for said matrix and said at least one segment; and intersecting said matrix with said at least one segment, said intersecting step comprising the steps of:

relating said vertices to said common origin to define a location of each of said vertices relative to said at least one segment;

evaluating said defined locations of said vertices to identify valid ones of said vertices; and determining the boundary surfaces of individual segments in accordance with said valid vertices.

11. The method according to claim 10 wherein said method further comprises the step of receiving from a user one or more attribute values for said segmented object, and wherein said relating step comprises the step of calculating said location of said vertices in light of at least said set values.

12. The method according to claim 10 wherein said intersecting step comprises the step of defining the boundary surfaces of a row of rectangular segments of the intersection.

13. The method according to claim 10 wherein said intersecting step comprises the step of defining the boundary surfaces of a column of rectangular segments of the intersection.

14. The method according to claim 10 wherein said evaluating step comprises the step of comparing said defined vertices to a set of geometric rules to identify invalid vertices.

15. The method according to claim 14 wherein said evaluating step further comprises the step of deleting said invalid vertices.

16. The method according to claim 10 wherein said intersecting step comprises the step of comparing the defined locations of the vertices to a set of geometric rules to identify any undesired segments.

17. The method according to claim 16 wherein said comparing step comprises the step of discarding said undesired segments.

18. The method according to claim 10 wherein said intersecting step comprises the step of warning a user of any invalid geometries.

* * * * *